United States Patent
Vich

(10) Patent No.: US 10,539,585 B2
(45) Date of Patent: Jan. 21, 2020

(54) ARRANGEMENT AND METHOD FOR CONNECTING AN ELECTRICAL COMPONENT TO A LEADFRAME

(71) Applicant: Continental Automotive Systems, Inc., Auburn Hills, MI (US)

(72) Inventor: Gaetan Vich, Clarkston, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 62 days.

(21) Appl. No.: 14/878,644

(22) Filed: Oct. 8, 2015

(65) Prior Publication Data

US 2016/0103147 A1 Apr. 14, 2016

Related U.S. Application Data

(60) Provisional application No. 62/061,857, filed on Oct. 9, 2014.

(51) Int. Cl.
| | | |
|---|---|---|
| *G01P 1/02* | (2006.01) | |
| *G01P 3/42* | (2006.01) | |
| *H05K 3/32* | (2006.01) | |
| *H01R 4/28* | (2006.01) | |
| *H05K 3/28* | (2006.01) | |

(52) U.S. Cl.
CPC ............ *G01P 1/026* (2013.01); *G01P 3/42* (2013.01); *H01R 4/28* (2013.01); *H05K 3/326* (2013.01); *H05K 3/28* (2013.01); *H05K 2201/0397* (2013.01); *H05K 2201/10151* (2013.01); *H05K 2201/10386* (2013.01); *H05K 2201/10446* (2013.01); *H05K 2201/10757* (2013.01);

(Continued)

(58) Field of Classification Search
USPC .......... 324/160, 156, 252, 244, 251; 29/832, 29/592.1, 834, 827, 874; 361/813; 174/536; 257/421, 676; 438/123; 312/223.1; 439/620.01; 73/493, 514.01
See application file for complete search history.

(56) References Cited

U.S. PATENT DOCUMENTS 4,305,013 A * 12/1981 Baier ................... G01L 23/222
310/329
4,870,224 A * 9/1989 Smith ................... H01L 23/315
174/528

(Continued)

FOREIGN PATENT DOCUMENTS

| DE | 102006046594 A1 | 4/2007 |
|---|---|---|
| EP | 0970564 A1 | 1/2000 |

(Continued)

OTHER PUBLICATIONS

European Search Report dated Mar. 1, 2016.

*Primary Examiner* — Melissa J Koval
*Assistant Examiner* — Nasima Monsur

(57) ABSTRACT

An automotive component assembly comprises an input circuit portion for a sensor and a component portion. The input circuit portion is aligned with the component portion in a desired assembly position. A pocket is at least partially defined by the component portion to receive the input circuit portion and a clamping force retains the input circuit portion between a first layer and a second layer of the component portion forming the pocket. An overmold material is applied to retain the input circuit portion and the component portion to one another.

7 Claims, 3 Drawing Sheets

(52) U.S. Cl.
CPC ............... *H05K 2203/1316* (2013.01); *H05K 2203/1327* (2013.01)

(56) References Cited

U.S. PATENT DOCUMENTS

| | | | | |
|---|---|---|---|---|
| 5,233,131 | A | * | 8/1993 | Liang ................. H01L 23/49531 174/532 |
| 5,525,956 | A | * | 6/1996 | Hashizume .............. H01C 1/14 338/162 |
| 5,743,751 | A | * | 4/1998 | Davis ................. H01R 12/7023 439/79 |
| 5,847,934 | A | | 12/1998 | Yasuda |
| 2002/0159238 | A1 | | 10/2002 | Gross et al. |
| 2008/0205015 | A1 | * | 8/2008 | Vich ................. H01L 23/49555 361/782 |
| 2011/0281472 | A1 | * | 11/2011 | Masuda ............... G01N 27/407 439/660 |
| 2013/0063903 | A1 | * | 3/2013 | Heim .................... H05K 3/325 361/728 |

FOREIGN PATENT DOCUMENTS

| | | | |
|---|---|---|---|
| GB | 1518397 | A | 7/1978 |
| JP | S61123818 | A | 6/1986 |
| WO | 2011113863 | A1 | 9/2011 |

* cited by examiner

ARRANGEMENT AND METHOD FOR CONNECTING AN ELECTRICAL COMPONENT TO A LEADFRAME

CROSS REFERENCE TO RELATED APPLICATION

This application claims priority to U.S. Provisional Application No. 62/061,857 filed on Oct. 9, 2014.

TECHNICAL FIELD

The present disclosure relates to automotive vehicles and more particularly to sensors and components which are connected to leadframes for automotive vehicles.

BACKGROUND

Automotive vehicles use many different types of sensor components, which need be mounted to a leadframe or a PCB for a component of the vehicle. Typically, the lead portion of the sensor input circuit (IC) is secured to the leadframe or PCB by soldering or welding.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

An automotive component assembly comprises an input circuit portion for a sensor and a component portion. The input circuit portion is aligned with the component portion in a desired assembly position. A pocket is at least partially defined by the component portion to receive the input circuit portion and a clamping force retains the input circuit portion between a first layer and a second layer of the component portion forming the pocket. An overmold material is applied to retain the input circuit portion and the component portion to one another.

A method of assembling an automotive component assembly comprises aligning an input circuit portion with a component portion in a desired assembly position and applying a clamping force to press a first layer and an second layer of the component portion toward one another, such that the input circuit portion is secured between the first layer and the second layer. An overmold material is applied to the assembled input circuit portion and the component portion to retain the input circuit portion and the component portion to one another.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
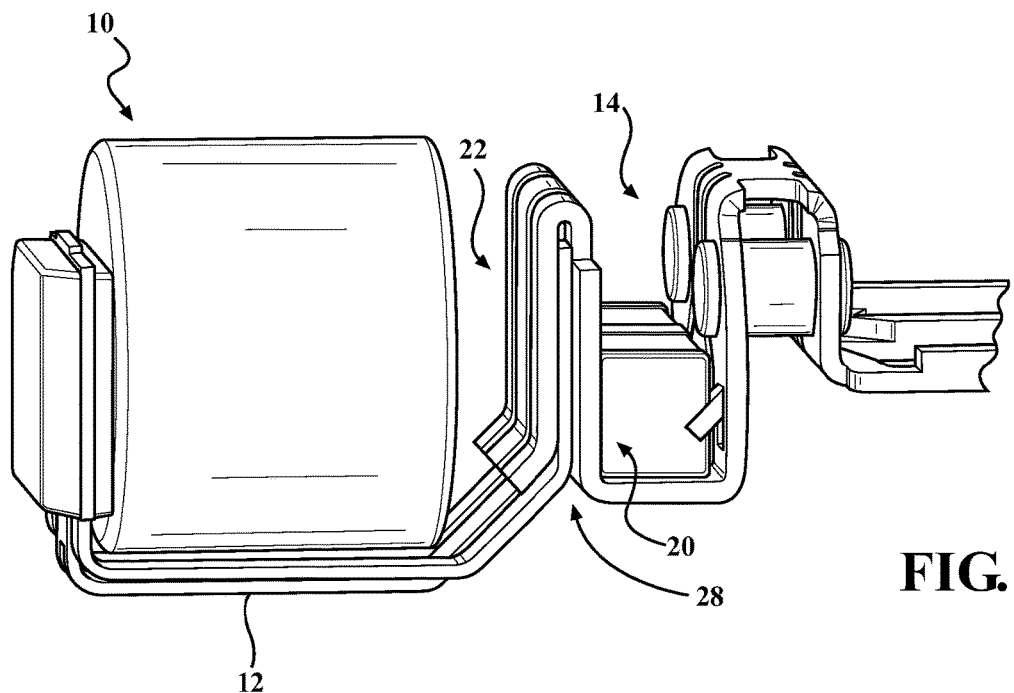
FIG. 1 is a schematic perspective view illustration of a first embodiment of the present invention of an arrangement for securing an input circuit to a leadframe.
Figure 2:
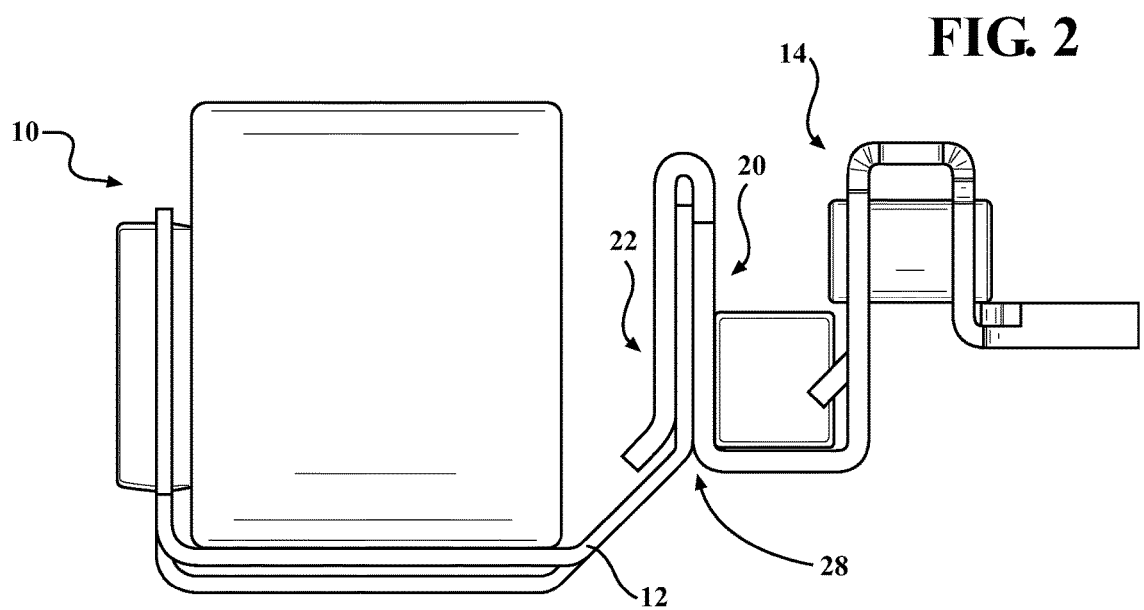
FIG. 2 is a schematic side view illustration of the first embodiment of the arrangement for securing the input circuit to the leadframe of FIG. 1.
Figure 3:
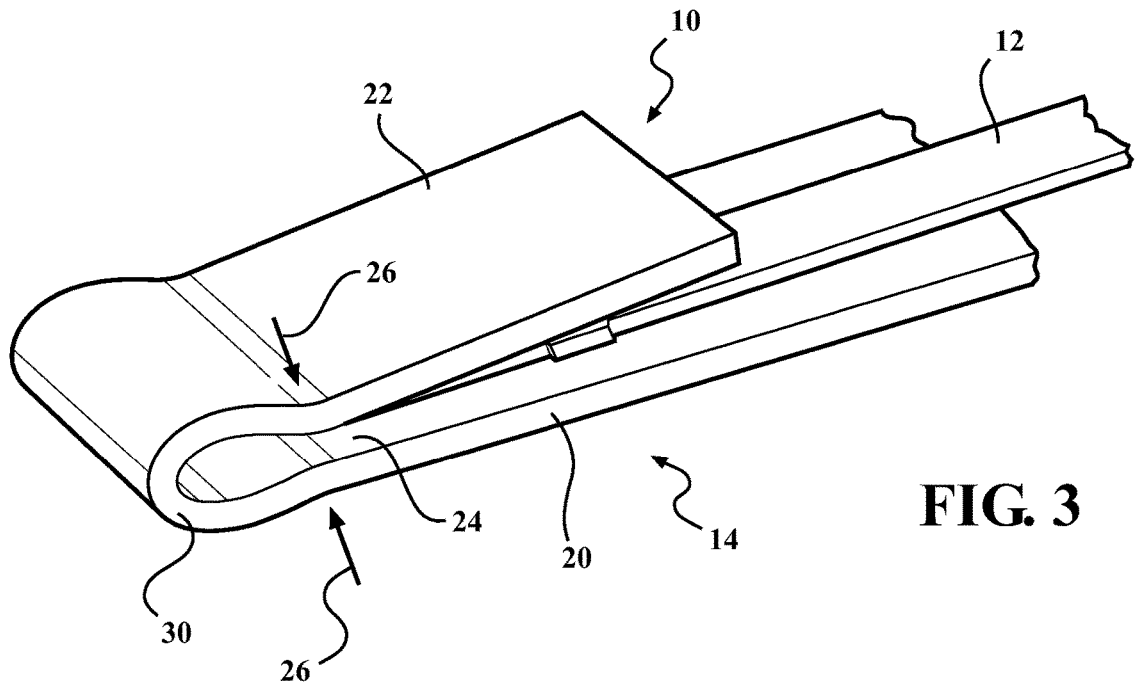
FIG. 3 is an enlarged schematic perspective view illustration of the first embodiment of the arrangement for securing the input circuit to the leadframe of FIGS. 1-2.
Figure 4:
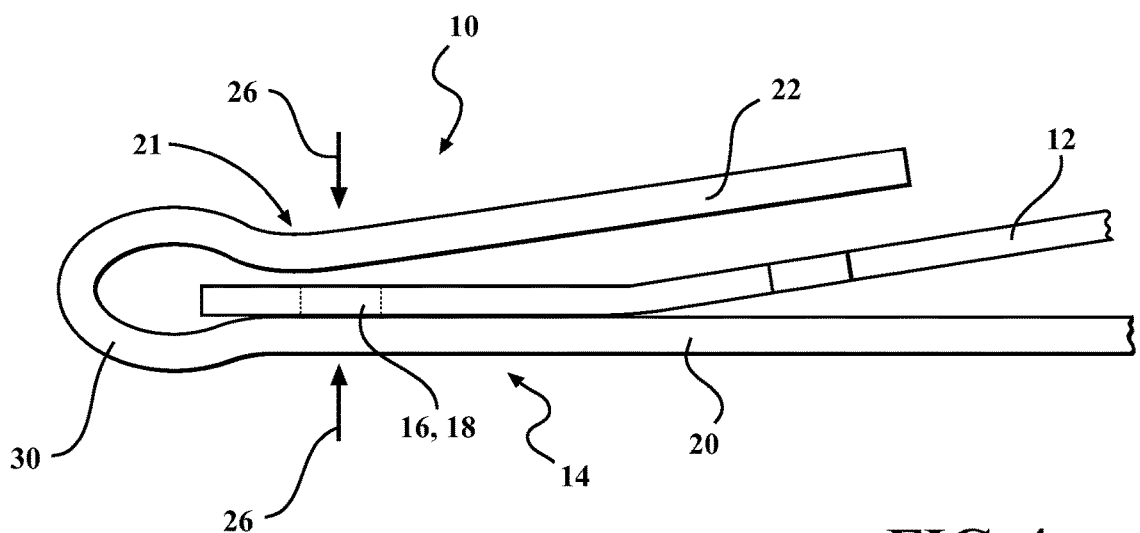
FIG. 4 is an enlarged schematic side view illustration of the first embodiment of the arrangement for securing the input circuit to the leadframe of FIGS. 1-3.

The following description is merely exemplary in nature and is in no way intended to limit the disclosure, its application, or uses. For purposes of clarity, the same reference numbers will be used in the drawings to identify similar elements. FIGS. 1-2 illustrate an automotive component assembly 10. The automotive component assembly 10 includes an input circuit portion 12 and a component portion 14. The input circuit portion 12 may be an input circuit for any type of sensor, such as an engine speed sensor. The component portion 14 may be any type of component which the input circuit portion 12 needs to be secured, such as a leadframe.

The input circuit portion 12 has a first terminal 16 and a second terminal 18 (not numbered), which must both be in electrical contact with the component portion 14 once assembled. The input circuit portion 12 portion is position along the component portion 14 in a desired assembly position. For example, the input circuit portion 12 is axially aligned along the leadframe.

The input circuit portion 12 is assembled to the component portion 14 by folding a portion of the component portion 14 back over itself, such that the input circuit portion 12 is positioned between a first layer 20 and a second layer 22 of the component portion 14. The first layer 20 and the second layer 22 define a pocket 24, which the input circuit portion 12 is located.

A clamping force 26 is applied to press the first layer 20 and the second layer 22 toward one another. The clamping force 26 applies enough pressure to the input circuit portion 12 to ensure sufficient contact between the terminals 16, 18 and the leadframe 14, while being low enough to not damage the input circuit portion 12. The clamping force 26 may be applied by any technique which is capable of applying the force in a manner that desired for a particular input circuit portion 12 and component portion 14 design.

Additionally, the component portion 14 may be shaped such that the pocket 24 is at least partially defined prior to the clamping force 26 being applied, with enough distance between the layers 20 and 22 to make insertion of the input circuit portion 12 easy. In this manner, the fold 30 defining a portion of the pocket 24 can be used as a guide for positioning the input circuit portion 12 relative to the component portion 14. The radius of the fold 30 may be optimized, for the desired shape of pocket 24 and contact between the layers 20, 22 and input circuit portion 12, especially the terminals 16, 18. Additionally contact points 32 (not shown) may be formed on the first layer 20 and/or second layer 22 designed to align with the terminals 16, 18 and provide the most favorable surface area and pressure of the contact between the component portion 14 and the terminals 16, 18.

Once the clamping force 26 has been applied, an overmold material 28 (not shown) is applied to the assembly 10 to secure the input circuit portion 12 and component portion 14 together. The overmold material 28 increases the resistance to vibration, thermo-mechanical stress, and other environmental stresses of the assembly 10.

The pressing operation for assembling the sensor portion 12 to the component portion 14 is faster and uses less material than the welding or soldering process of securing the sensor portion 12 to the leadframe 14.

Figure 5:
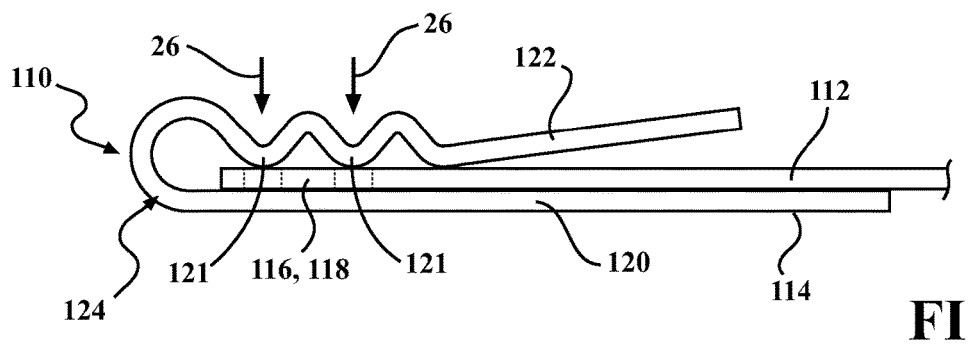
FIG. 5 is a schematic side view illustration of a second embodiment of the present invention.

FIG. 5 illustrates a second embodiment of an assembly 110 having the sensor portion 112 and the component portion 114. First layer 120 and second layer 122 are spaced part to receive the sensor portion 112. The pocket 124 has a specified shape and diameter that is ideal for that particular assembly 110. The second layer 122 is shaped to have multiple contact points 121. The sensor 112 should be positioned such that terminals 116, 118 substantially align with the contact points 121. Force 26 is applied at the contact points 121 such that the first layer 120, second layer 122 and sensor 112 have electrical contact with one another.

Figure 6:
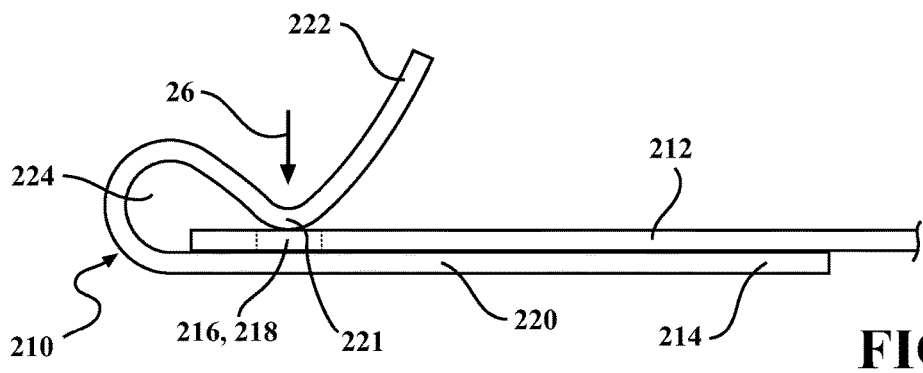
FIG. 6 is a schematic side view illustration of a third embodiment of the present invention.

FIG. 6 illustrates a third embodiment of an assembly 210 having the sensor portion 212 and the component portion 214. First layer 220 and second layer 222 are spaced part to receive the sensor portion 212. The pocket 224 has a specified shape and diameter that is ideal for that particular assembly 210. The second layer 222 has a shape the extends in a curved manner away from the first layer 220 to have a wide lead in opening for receiving the sensor portion 212. The sensor 212 should be positioned such that terminals 216, 218 are substantially aligned with a contact point 221. Force 26 is applied at the contact point 221 such that the first layer 220, second layer 222 and sensor 212 have electrical contact with one another.

Figure 7:
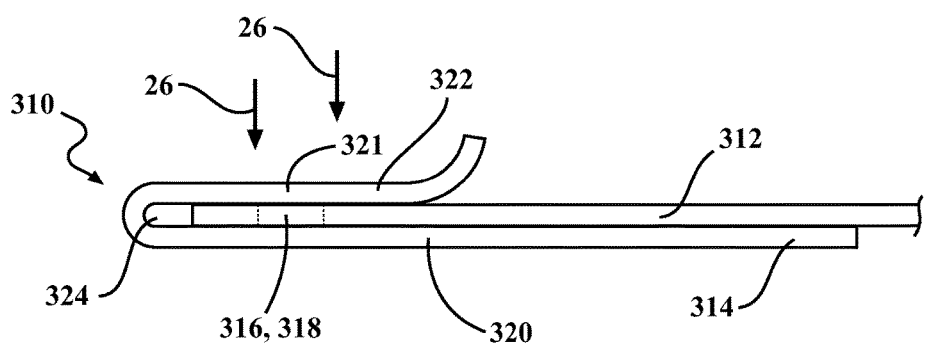
FIG. 7 is a schematic side view illustration of a fourth embodiment of the present invention.

FIG. 7 illustrates a fourth embodiment of an assembly 310 having the sensor portion 312 and the component portion 314. First layer 320 and second layer 322 are spaced part to receive the sensor portion 312. The pocket 324 has a specified shape and diameter that is ideal for that particular assembly 310. In this embodiment the pocket is small such that contact 321 between the second layer 322 and the sensor 312 occurs over a predefined area instead of at a single point. The second layer 322 has a shape the extends in a curved manner away from the first layer 320 to have a lead in opening for receiving the sensor portion 312 to make assembly of the components easier. The sensor 312 should be positioned such that terminals 316, 318 are substantially aligned with the contact area 321. Force 26 is applied at the contact area 321 in multiple locations, such that the first layer 320, second layer 322 and sensor 312 have electrical contact with one another.

Figure 8:
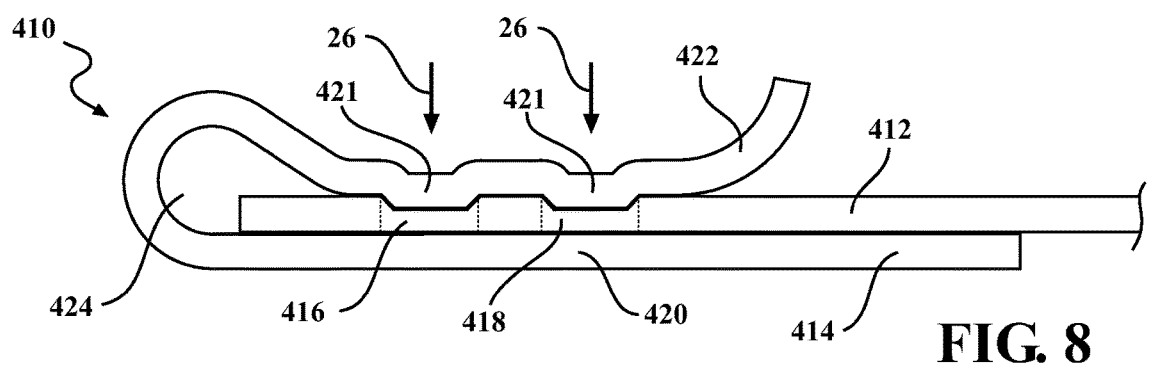
FIG. 8 is a schematic side view illustration of a fifth embodiment of the present invention.

FIG. 8 illustrates a fourth embodiment of an assembly 410 having the sensor portion 412 and the component portion 414. First layer 420 and second layer 422 are spaced part to receive the sensor portion 412. The pocket 424 has a specified shape and diameter that is ideal for that particular assembly 410. The second layer 422 has a shape the extends in a curved manner away from the first layer 420 to have a lead in opening for receiving the sensor portion 412 to make assembly of the components easier. The sensor 412 should be positioned such that terminals 416, 418 are substantially aligned with the contact points 421. Force 26 is applied at the contact points 421, such that the first layer 420, second layer 422 and sensor 412 have electrical contact with one another. Sufficient force 26 may be applied to deform the second layer 422 and sensors 412 to increase the contact between sensor 412 and component portion and ensure sufficient electrical contact.

While the best modes for carrying out the invention have been described in detail the true scope of the disclosure should not be so limited, since those familiar with the art to which this invention relates will recognize various alternative designs and embodiments for practicing the invention within the scope of the appended claims.

What is claimed is:

1. A component assembly comprising:
   an input circuit portion for an electronic component, said input circuit portion being electrically conductive and extending to at least one terminal;
   a component portion, wherein the at least one terminal is aligned with the component portion in a desired assembly position;
   the component portion folded back over itself to delineate a first layer and a second layer; and
   a pocket at least partially defined by first layer and the second layer of the component portion;
   wherein a clamping force deforms the second layer and the at least one terminal to increase the contact between the second layer and the at least one terminal and retain the at least one terminal between the first layer and the second layer of the component portion.

2. The component assembly of claim 1, wherein the component portion is a leadframe.

3. The component assembly of claim 1, wherein the electronic component is an engine speed sensor.

4. The component assembly of claim 1, wherein the at least one terminal includes a first terminal and a second terminal and contact points on at least one of the first layer and the second layer are aligned with the first and second terminals.

5. A method of assembling an automotive component assembly comprising:
   folding a component portion back over itself to delineate a first layer and a second layer and a pocket therebetween;
   aligning at least one terminal of an input circuit portion formed of an electrically conductive material in the pocket defined by the component portion in a desired assembly position; and
   applying a clamping force to press the first layer and the second layer of the component portion toward one another, such that the second layer and the at least one terminal are deformed and the at least one terminal is secured between the first layer and the second layer.

6. The method of claim 5, wherein the component portion is a leadframe.

7. The method of claim 5, wherein the at least one terminal includes a first terminal and a second terminal and further comprising aligning contact points on at least one of the first layer and the second layer with respective first and second terminals on the input circuit portion.

* * * * *